US010263211B2

(12) United States Patent
Byun et al.

(10) Patent No.: US 10,263,211 B2
(45) Date of Patent: Apr. 16, 2019

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: WooJung Byun, Goyang-si (KR); HanGyu Jung, Paju-si (KR); Yongsun Jo, Seoul (KR); SungSoo Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/700,385

(22) Filed: Sep. 11, 2017

(65) Prior Publication Data

US 2018/0123078 A1 May 3, 2018

(30) Foreign Application Priority Data

Oct. 27, 2016 (KR) .................. 10-2016-0141232

(51) Int. Cl.
*H01L 27/12* (2006.01)
*H01L 27/32* (2006.01)
*H01L 51/52* (2006.01)

(52) U.S. Cl.
CPC .......... *H01L 51/5206* (2013.01); *H01L 27/12* (2013.01); *H01L 27/3246* (2013.01); *H01L 27/3262* (2013.01); *H01L 27/3272* (2013.01); *H01L 27/3279* (2013.01); *H01L 51/5228* (2013.01)

(58) Field of Classification Search
CPC ............ H01L 51/5206; H01L 51/5228; H01L 51/504; H01L 51/5064; H01L 51/508; H01L 51/5278; H01L 27/3272; H01L 27/3246; H01L 33/12; H01L 33/22; H01L 33/24
See application file for complete search history.

(56) References Cited

U.S. PATENT DOCUMENTS

| 2005/0110023 A1* | 5/2005 | Lee .................. H01L 27/3276 257/72 |
| 2006/0279206 A1* | 12/2006 | Noriyuki .............. C09K 11/681 313/506 |
| 2007/0075313 A1* | 4/2007 | Kwak .................. H01L 27/124 257/59 |

(Continued)

*Primary Examiner* — Joseph L Williams
*Assistant Examiner* — Jose M Diaz
(74) *Attorney, Agent, or Firm* — Morgan, Lewis & Bockius LLP

(57) ABSTRACT

Disclosed is an organic light emitting display device that may include a substrate having an active area and a pad area, a passivation layer provided on the active area of the substrate, an anode electrode provided on the passivation layer, a bank layer for defining a pixel region on the anode electrode, an organic emitting layer provided on the bank layer and connected with the anode electrode, a cathode electrode provided on the organic emitting layer, and an auxiliary electrode electrically connected with the cathode electrode and provided under the passivation layer, wherein a contact hole for exposing the auxiliary electrode is provided in the passivation layer, the auxiliary electrode includes a lower auxiliary electrode and an upper auxiliary electrode, and the cathode electrode is in contact with an upper surface of the lower auxiliary electrode via the contact hole.

23 Claims, 10 Drawing Sheets

(56) References Cited

U.S. PATENT DOCUMENTS

| | | | |
|---|---|---|---|
| 2007/0222379 A1* | 9/2007 | Yamazaki | H01L 27/3209 313/509 |
| 2010/0066240 A1* | 3/2010 | Park | H01L 27/3246 313/504 |
| 2010/0072482 A1* | 3/2010 | Eom | H01L 27/3276 257/72 |
| 2013/0056784 A1* | 3/2013 | Lee | H01L 27/3246 257/99 |
| 2014/0346448 A1* | 11/2014 | You | H01L 51/5228 257/40 |
| 2015/0206929 A1* | 7/2015 | Sato | H01L 27/32 257/40 |
| 2016/0149155 A1* | 5/2016 | Kim | H01L 51/5228 257/40 |
| 2018/0006098 A1* | 1/2018 | Hong | H01L 27/124 |
| 2018/0046221 A1* | 2/2018 | Choi | G02B 26/0825 |
| 2018/0102499 A1* | 4/2018 | Pyo | H01L 51/5228 |

* cited by examiner

ORGANIC LIGHT EMITTING DISPLAY DEVICE AND METHOD OF MANUFACTURING THE SAME

CROSS REFERENCE TO RELATED APPLICATIONS

This application claims the benefit of the Korean Patent Application No. 10-2016-0141232 filed on Oct. 27, 2016, which is hereby incorporated by reference as if fully set forth herein.

BACKGROUND

Field of the Disclosure

Embodiments of the present invention relate to an organic light emitting display device, and more particularly, to a top emission type organic light emitting display device and a method of manufacturing the same.

Discussion of the Related Art

An organic light emitting display (OLED) device, which is a self light emitting display device, has advantages of low power consumption, rapid response speed, high emission efficiency, high luminance, and wide viewing angle.

According to a direction of light emitted from an organic light emitting device, the OLED device may be largely classified into a top emission type and a bottom emission type. In case of the bottom emission type, a circuit device is disposed between an emitting layer and an image displaying surface, whereby an aperture ratio may be lowered due to the circuit device. Meanwhile, in case of the top emission type, a circuit device is not disposed between an emitting layer and an image displaying surface, whereby an aperture ratio may be improved.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 80 to be explained later.

On the anode electrode 40 and the auxiliary electrode 50, a bank 60 is provided to define a pixel region. Also, an organic emitting layer 70 is provided in the pixel region defined by the bank 60, and the cathode electrode 80 is provided on the organic emitting layer 70.

In case of the top emission type, light emitted from the organic emitting layer 70 passes through the cathode electrode 80. In this reason, the cathode electrode 80 is formed of a transparent conductive material, which causes the increase of resistance therein. In order to lower the resistance in the cathode electrode 80, the cathode electrode 80 is connected with the auxiliary electrode 50.

In order to connect the cathode electrode 80 with the auxiliary electrode 50, an upper surface of the auxiliary electrode 50 is not covered by the organic emitting layer 70. That is, the upper surface of the auxiliary electrode 50 is exposed to the outside after a process of forming the organic emitting layer 70 so that the cathode electrode 80 is connected with the upper surface of the auxiliary electrode 50. In case of the related art, a reverse-tapered partition 65 is provided on the upper surface of the auxiliary electrode 50 so as to prevent the upper surface of the auxiliary electrode 50 from being covered by the organic emitting layer 70.

Owing to the reverse-tapered partition 65, a gap space is provided between the bank 60 and the partition 65. In this case, the reverse-tapered partition 65 serves as an eave so that the organic emitting layer 70 is not deposited in the gap space. That is, the organic emitting layer 70 is formed by a deposition process using a deposition material with superior straightness, for example, evaporation process. According as the partition 65 serves as the eave during the deposition process of the organic emitting layer 70, the organic emitting layer 70 is not deposited in the gap space between the bank 60 and the partition 65.

Meanwhile, the cathode electrode 80 may be formed by a deposition process using a deposition material with inferior straightness, for example, sputtering process. Thus, the cathode electrode 80 may be deposited in the gap space between the bank 60 and the partition 65, whereby the cathode electrode 80 and the auxiliary electrode 50 may be electrically connected with each other.

However, the related art top emission type OLED device inevitably including the reverse-tapered partition 65 may cause the following disadvantages.

A PEB (Post Exposure Bake) process should be carried out so as to pattern the reverse-tapered partition 65. The PEB process is very complicated so that it is difficult to obtain a desired reverse-tapered shape. If the reverse-tapered structure is not formed in a desired shape, the partition 65 may be collapsed or peeled-off. In this case, it is difficult to electrically connect the cathode electrode 80 and the auxiliary electrode 50 with each other.

SUMMARY

Accordingly, embodiments of the present invention are directed to an organic light emitting display device and a method of manufacturing the same that substantially obviate one or more problems due to limitations and disadvantages of the related art, and a method of manufacturing the same.

An aspect of embodiments of the present invention is to provide a top emission type organic light emitting display device which facilitates an electrical connection between a cathode electrode and an auxiliary electrode without forming a reverse-tapered partition, and a method of manufacturing the same. Accordingly, in case of not forming a reverse-tapered partition, the display area of the top emission type organic light emitting display device is broadened.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, an organic light emitting display device comprises a substrate having an active area and a pad area, a passivation layer provided on the active area of the substrate, an anode electrode provided on the passivation layer, a bank layer for defining a pixel region on the anode electrode, an organic emitting layer provided on the bank layer and connected with the anode electrode, a cathode electrode provided on the organic emitting layer, and an auxiliary electrode electrically connected with the cathode electrode and provided under the passivation layer, wherein a contact hole for exposing the auxiliary electrode is provided in the passivation layer, and the cathode electrode is in contact with an upper surface of the auxiliary electrode via the contact hole.

In another aspect, a method of manufacturing an OLED devices comprises providing an auxiliary electrode including a lower auxiliary electrode and an upper auxiliary electrode on a substrate, providing a passivation layer and a planarization layer on the auxiliary electrode, wherein a contact hole for exposing the auxiliary electrode is provided in the passivation layer and the planarization layer, providing an anode electrode on the planarization layer, providing a bank layer on the anode electrode, providing an organic emitting layer on the bank layer, and providing a cathode electrode on the organic emitting layer, wherein the cathode electrode is brought into contact with an upper surface of the lower auxiliary electrode via the contact hole.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
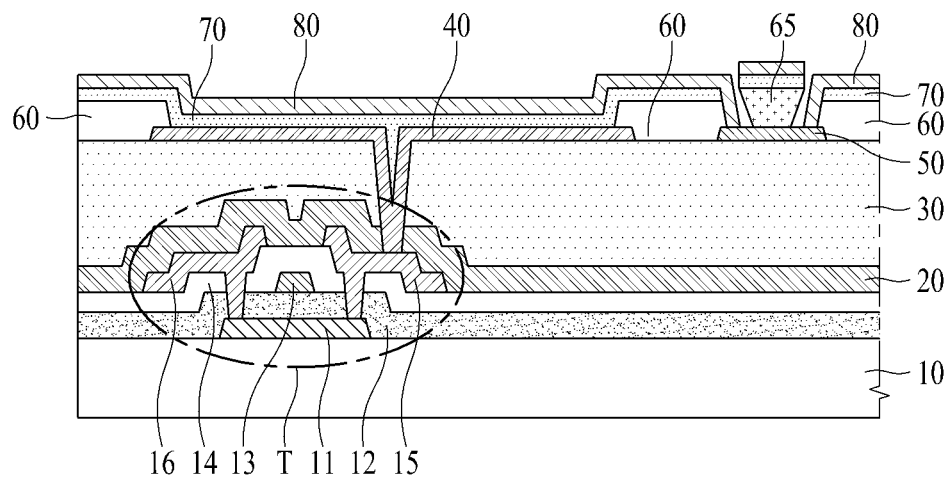
FIG. 1 is a cross sectional view illustrating a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In description of embodiments of the present invention, when a structure is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display (OLED) device according to embodiments of the present invention will be described in detail with reference to the accompanying drawings.

FIG. 2A is a cross sectional view illustrating an OLED device according to one embodiment of the present invention.

As shown in FIG. 2A, the OLED device according to one embodiment of the present invention may include an active area (AA) and a pad area (PA) on a substrate 100.

First, a structure of the active area (AA) on the substrate 100 will be described in detail as follows.

The substrate 100 may be formed of glass or transparent plastic.

A light shielding layer 110 and a low-voltage line (VSS) 120 are provided on the substrate 100.

The light shielding layer 110 prevents a light incidence on an active layer 126 to be explained later, and the low-voltage line (VSS) 120 applies a low voltage to a cathode electrode 220. Also, the low-voltage line (VSS) 120 together with an auxiliary electrode 170 lowers a resistance of the cathode electrode 220.

The light shielding layer 110 and the low-voltage line (VSS) 120 are provided in the same layer, and are formed of the same material. In this case, the light shielding layer 110 and the low-voltage line (VSS) 120 may be manufactured at the same time by the same process.

The light shielding layer 110 may include a lower light shielding layer 111 and an upper light shielding layer 112.

The low-voltage line (VSS) 120 may include a lower low-voltage line (VSS) 121 and an upper low-voltage line (VSS) 122. The lower light shielding layer 111 and the lower low-voltage line (VSS) 121 may be formed of the same material, and the upper light shielding layer 112 and the upper low-voltage line (VSS) 122 may be formed of the same material.

The lower light shielding layer 111 prevents a lower surface of the upper light shielding layer 112 from being corroded. The lower low-voltage line (VSS) 121 prevents a lower surface of the upper low-voltage line (VSS) 122 from being corroded. Accordingly, an oxidation degree of each of the lower light shielding layer 111 and the lower low-voltage line (VSS) 121 is lower than an oxidation degree of each of the upper light shielding layer 112 and the upper low-voltage line (VSS) 122, and a corrosion resistance in each of the lower light shielding layer 111 and the lower low-voltage line (VSS) 121 is superior to a corrosion resistance in each of the upper light shielding layer 112 and the upper low-voltage line (VSS) 122. For example, the lower light shielding layer 111 and the lower low-voltage line (VSS) 121 may be formed of an alloy (MoTi) of molybdenum and titanium, but not limited to this material.

A resistance in a material for the upper light shielding layer 112 and the upper low-voltage line (VSS) 122 may be lower than a resistance in a material for the lower light shielding layer 111 and the lower low-voltage line (VSS) 121. For example, the upper light shielding layer 112 and the upper low-voltage line (VSS) 122 may be formed of a metal material such as copper (Cu), but not limited to this material. In order to lower a total resistance of the low-voltage line (VSS) 120, a thickness of the upper low-voltage line (VSS) 122 is larger than a thickness of the lower low-voltage line (VSS) 121, preferably.

A buffer layer 125 is provided on the light shielding layer 110 and the low-voltage line (VSS) 120. The buffer layer 125 extends from the active area (AA) to the pad area (PA). The buffer layer 125 may be formed of an inorganic insulating material, for example, a silicon oxide film (SiOx), a silicon nitride film (SiNx), or a multi-layered film including silicon oxide (SiOx) and silicon nitride (SiNx), but not limited to those.

A thin film transistor including the active layer 126, a gate electrode 130, a source electrode 150, and a drain electrode 160 is provided on the buffer layer 125.

The active layer 126 is provided on the buffer layer 125, a gate insulating film 127 is provided on the active layer 126, the gate electrode 130 is provided on the gate insulating film 127, and an insulating interlayer 140 is provided on the gate electrode 130. Then, the source electrode 150, the drain electrode 160, and the auxiliary electrode 170 are provided on the insulating interlayer 140.

The active layer 126 may be formed of a silicon-based semiconductor material or an oxide-based semiconductor material.

The gate insulating film 127 insulates the active layer 126 and the gate electrode 130 from each other. The gate insulating film 127 and the gate electrode 130 may have the same pattern. The gate insulating film 127 may be formed of an inorganic insulating material, for example, a silicon oxide film (SiOx), a silicon nitride film (SiNx), or a multi-layered film including silicon oxide (SiOx) and silicon nitride (SiNx), but not limited to those.

The gate electrode 130 may include a lower gate electrode 131 and an upper gate electrode 132. The lower gate electrode 131 prevents a lower surface of the upper gate electrode 132 from being corroded. Thus, an oxidation degree of a material for the lower gate electrode 131 is lower than an oxidation degree of a material for the upper gate electrode 132, and a corrosion resistance of the material for the lower gate electrode 131 is superior to a corrosion resistance of the material for the upper gate electrode 132. For example, the lower gate electrode 131 may be formed of an alloy (MoTi) of molybdenum and titanium, but not limited to this material. A resistance in the material for the upper gate electrode 132 may be lower than a resistance in the material for the lower gate electrode 131. For example, the upper gate electrode 132 may be formed of a metal material such as copper (Cu), but not limited to this material. In order to lower a total resistance of the gate electrode 130, a thickness of the upper gate electrode 132 is larger than a thickness of the lower gate electrode 131, preferably.

The insulating interlayer 140 may be formed of an inorganic insulating material, for example, a silicon oxide film (SiOx), a silicon nitride film (SiNx), or a multi-layered film including silicon oxide (SiOx) and silicon nitride (SiNx), but not limited to those. The insulating interlayer 140 may extend from the active area (AA) to the pad area (PA).

The source electrode 150 and the drain electrode 160 facing each other are provided on the insulating interlayer 140. In the insulating interlayer 140, there are a first contact hole (CH1) for exposing one end area of the active layer 126, and a second contact hole (CH2) for exposing the other end area of the active layer 126. The source electrode 150 is connected with one end area of the active layer 126 via the first contact hole (CH1), and the drain electrode 160 is connected with the other end area of the active layer 126 via the second contact hole (CH2).

Also, a third contact hole (CH3) for exposing the light shielding layer 110 is provided in the buffer layer 125 and the insulating interlayer 140. The source electrode 150 is connected with the light shielding layer 110 via the third contact hole (CH3). The light shielding layer 110 is formed of a conductive material. If the light shielding layer 110 is in a floating state, it may have a bad influence on the active layer 126. According as the light shielding layer 110 is connected with the source electrode 150, it is possible to prevent the bad influence on the active layer 126. If needed, the light shielding layer 110 may be connected with the drain electrode 160.

Also, a fourth contact hole (CH4) for exposing the low-voltage line (VSS) 120 is provided in the buffer layer 125 and the insulating interlayer 140, and the auxiliary electrode 170 is connected with the low-voltage line (VSS) 120 via the fourth contact hole (CH4). The auxiliary electrode 170 functions as a connection electrode for connecting the cathode electrode 220 with the low-voltage line (VSS) 120. According to one embodiment of the present invention, a resistance of the cathode electrode 220 may be lowered by the low-voltage line (VSS) 120 and the auxiliary electrode 170.

The source electrode 150, the drain electrode 160, and the auxiliary electrode 170 may be provided in the same layer, and may be formed of the same material. In this case, the source electrode 150, the drain electrode 160, and the auxiliary electrode 170 may be manufactured at the same time by the same process.

The source electrode 150 may include a lower source electrode 151 and an upper source electrode 152. The drain electrode 160 may include a lower drain electrode 161 and an upper drain electrode 162. The auxiliary electrode 170 may include a lower auxiliary electrode 171 and an upper auxiliary electrode 172.

The lower source electrode 151, the lower drain electrode 161, and the lower auxiliary electrode 171 may be formed of the same material. The upper source electrode 152, the upper drain electrode 162, and the upper auxiliary electrode 172 may be formed of the same material.

The lower source electrode 151 prevents a lower surface of the upper source electrode 152 from being corroded. The lower drain electrode 161 prevents a lower surface of the upper drain electrode 162 from being corroded. The lower auxiliary electrode 171 prevents a lower surface of the upper auxiliary electrode 172 from being corroded. Accordingly, an oxidation degree in a material for each of the lower source electrode 151, the lower drain electrode 161, and the lower auxiliary electrode 171 is lower than an oxidation degree in a material for each of the upper source electrode 152, the upper drain electrode 162, and the upper auxiliary electrode 172. Also, a corrosion resistance in the material for each of the lower source electrode 151, the lower drain electrode 161, and the lower auxiliary electrode 171 is superior to a corrosion resistance in the material for each of the upper source electrode 152, the upper drain electrode 162, and the upper auxiliary electrode 172. For example, the lower source electrode 151, the lower drain electrode 161, and the lower auxiliary electrode 171 may be formed of an alloy (MoTi) of molybdenum and titanium, but not limited to this material.

A resistance in the material for the upper source electrode 152, the upper drain electrode 162, and the upper auxiliary electrode 172 may be lower than a resistance in the material for the lower source electrode 151, the lower drain electrode 161, and the lower auxiliary electrode 171. For example, the upper source electrode 152, the upper drain electrode 162, and the upper auxiliary electrode 172 may be formed of a metal material such as copper (Cu), but not limited to this material.

In order to lower a total resistance of the source electrode 150, a thickness of the upper source electrode 152 is larger than a thickness of the lower source electrode 151, preferably. In the same manner, a thickness of the upper drain electrode 162 is larger than a thickness of the lower drain electrode 161, preferably. Also, a thickness of the upper auxiliary electrode 172 is larger than a thickness of the lower auxiliary electrode 171, preferably.

A structure of the thin film transistor is not limited to the above structure, that is, a structure of the thin film transistor may be changed to various shapes generally known to those in the art. For example, the drawing shows a top gate structure where the gate electrode 130 is provided on the active layer 126, but not limited to this structure. That is, it is possible to provide a bottom gate structure where the gate electrode 130 is provided below the active layer 126.

The lower source electrode 151 and the upper source electrode 152 are provided in the same pattern, and the lower drain electrode 161 and the upper drain electrode 162 are provided in the same pattern. However, a pattern of the lower auxiliary electrode 171 is different from a pattern of the upper auxiliary electrode 172. In detail, an extending portion of the lower auxiliary electrode 171 is relatively longer than an extending portion of the upper auxiliary electrode 172. Especially, as compared with the upper auxiliary electrode 172, the lower auxiliary electrode 171 extends more deeply into a sixth contact hole (CH6). That is, there is a contact space (C) which is prepared by removing the upper auxiliary electrode 172 from the sixth contact hole (CH6), and the lower auxiliary electrode 171 extends into the contact space (C). Thus, in the contact space (C), the extending portion of the lower auxiliary electrode 171 is exposed to the outside, and is connected with the cathode electrode 220. More specifically, in the contact space (C), an upper surface of the extending portion of the lower auxiliary electrode 171 is in contact with a lower surface of the cathode electrode 220.

In order to provide the lower auxiliary electrode 171 whose extending portion is longer than the extending portion of the upper auxiliary electrode 172, the lower auxiliary electrode 171 is formed of a material which is not etched by an etchant used for forming the pattern of the anode electrode 180 to be explained later, and the upper auxiliary electrode 172 is formed of a material which is capable of being etched by the etchant used for forming the pattern of the anode electrode 180 to be explained later. This will be readily understood with the following manufacturing process.

A passivation layer 175 is provided on the source electrode 150, the drain electrode 160, and the auxiliary electrode 170.

The passivation layer 175 protects the thin film transistor, and the passivation layer 175 extends from the active area (AA) to the pad area (PA). The passivation layer 175 is formed of an inorganic insulating material, for example, a silicon oxide film (SiOx) or a silicon nitride film (SiNx), but not limited to those.

The sixth contact hole (CH6) for exposing the auxiliary electrode 170 is provided in the passivation layer 175. Under one end of the passivation layer 175 being in contact with the sixth contact hole (CH6), the contact space (C) may be prepared by removing the upper auxiliary electrode 172, as described above. Accordingly, as shown in the following manufacturing process, one end of the passivation layer 175 functions as an eave so that it facilitates an electrical connection between the cathode electrode 220 and the auxiliary electrode 170 in the contact space (C).

A planarization layer 178 is provided on the passivation layer 175. The planarization layer 178 is provided to planarize an upper surface of the substrate 100 with the thin film transistor. The planarization layer 178 may be formed of an organic insulating material, for example, acryl resin, epoxy resin, phenolic resin, polyamide resin, polyimide resin, and etc., but not limited to these materials.

According as the sixth contact hole (CH6) for exposing the auxiliary electrode 170 is provided in the planarization layer 178, the cathode electrode 220 may be connected with the auxiliary electrode 170 via the sixth contact hole (CH6). In this case, the sixth contact hole (CH6) provided in the planarization layer 178 may be larger than the sixth contact hole (CH6) provided in the passivation layer 175.

An anode electrode 180 is provided on the planarization layer 178.

A fifth contact hole (CH5) for exposing the source electrode 150 is provided in the passivation layer 175 and the planarization layer 178, and the anode electrode 180 is connected with the source electrode 150 via the fifth contact hole (CH5). According to a driving mode, the fifth contact hole (CH5) may expose the drain electrode 160, and the anode electrode 180 may be connected with the drain electrode 160.

The anode electrode 180 may include a lower anode electrode 181, an upper anode electrode 182, and a cover anode electrode 183.

The lower anode electrode 181 enhances an adhesive strength between the planarization layer 178 and the upper anode electrode 182, and the lower anode electrode 181 prevents a lower surface of the upper anode electrode 182 from being corroded. Accordingly, the lower anode electrode 181 may be formed of a material with relatively-low oxidation degree and relatively-high corrosion resistance in comparison to the upper anode electrode 182, for example, Indium-Tin-Oxide (ITO), but not limited to this material.

The upper anode electrode 182 is provided between the lower anode electrode 181 and the cover anode electrode 183. The upper anode electrode 182 may be formed of a metal material whose resistance is relatively lower than that of the lower anode electrode 181 and the cover anode electrode 183, for example, argentums (Ag), but not limited to this material.

In order to lower a total resistance of the anode electrode 180, a thickness of the upper anode electrode 182 is larger than a thickness of each of the lower anode electrode 181 and the cover anode electrode 183, preferably.

The cover anode electrode 183 prevents a corrosion of the upper anode electrode 182. The cover anode electrode 183 may be formed of a material with relatively-low oxidation degree and relatively-high corrosion resistance in comparison to the upper anode electrode 182, for example, Indium-Tin-Oxide (ITO), but not limited to this material.

A bank layer 200a, 200b, and 200c is provided on the anode electrode 180 and the planarization layer 178, and a pixel region is defined by the bank layer 200a, 200b, and 200c.

The bank layer 200a, 200b, and 200c may include a first bank 200a, a second bank 200b, and a third bank 200c.

The first bank 200a covers one end of the anode electrode 180, and the second bank 200b covers the other end of the anode electrode 180. In an area between the first bank 200a and the second bank 200b, an upper surface of the anode electrode 180 is exposed, and light is emitted in the area of the upper surface of the exposed anode electrode 180, to thereby display an image.

The second bank 200b extends to the inside of the sixth contact hole (CH6). In more detail, the second bank 200b may extend along lateral surfaces of the planarization layer 178 and the passivation layer 175 provided inside the sixth contact hole (CH6). According as some the second bank 200b extends to the area of the sixth contact hole (CH6), the cathode electrode 220 may be easily connected with the auxiliary electrode 170 along the extending second bank 200b. That is, as shown in the drawings, if some of the second bank 200b extends to the area of the sixth contact hole (CH6), an organic emitting layer 210 and the cathode electrode 220 may be sequentially deposited on the upper surface of the extending second bank 200b, whereby the cathode electrode 220 may be brought into contact with the upper surface of the auxiliary electrode 170. If the second bank 200b does not extend to the area of the sixth contact hole (CH6), it has a possibility of disconnection in the cathode electrode 220 extending to the area of the sixth contact hole (CH6).

The third bank 200c is provided on the upper surface of the planarization layer 178 above the auxiliary electrode 170. The third bank 200c may extend to the upper surface of the passivation layer 175 along the lateral surface of the planarization layer 178 provided inside the sixth contact hole (CH6), but not limited to this structure.

The bank layer 200a, 200b, and 200c may be formed of an organic insulating material, for example, polyimide resin, acryl resin, benzocyclobutene BCB, and etc., but not limited to these materials.

The organic emitting layer 210 is provided on the bank layer 200a, 200b, and 200c, and the cathode electrode 220 is provided on the organic emitting layer 210.

The organic emitting layer 210 is brought into contact with the anode electrode 180 in the area between the first bank 200a and the second 200b. Also, while the organic emitting layer 210 extends to the area of the sixth contact hole (CH6) along the second bank 200b, the organic emitting layer 210 is brought into contact with some area of the upper surface of the lower auxiliary electrode 171. Thus, it facilitates the contact between the cathode electrode 220 and the upper surface of the lower auxiliary electrode 171.

In this case, the organic emitting layer 210 is not provided in the contact space (C) under one end of the passivation layer 175 functioning as the eave. Thus, the upper surface of the auxiliary electrode 170 is exposed in the contact space (C). The organic emitting layer 210 may be manufactured by a deposition process using a deposition material with superior straightness, for example, evaporation process. Thus, the organic emitting layer 210 is not deposited in the contact space (C) under one end of the passivation layer 175 functioning as the eave for the deposition process of the organic emitting layer 210.

Also, the organic emitting layer 210 may be provided on the third bank 200c. Specifically, the organic emitting layer 210 may extend to the upper surface of the passivation layer 175 along the lateral surface of the third bank 200c.

The organic emitting layer 210 may include a hole injecting layer, a hole transporting layer, an emitting layer, an electron transporting layer, and an electron injecting layer. A structure of the organic emitting layer 210 may be changed to various shapes generally known to those in the art.

The cathode electrode 220 is provided in a light-emission surface, whereby the cathode electrode 220 is formed of a transparent conductive material. In order to lower a resistance of the cathode electrode 220, the cathode electrode 220 is connected with the auxiliary electrode 170. In more detail, the cathode electrode 220 extends to the area of the sixth contact hole (CH6). Specifically, the cathode electrode 220 extends to the inside of the contact space (C), and the extending cathode electrode 220 is brought into contact with the upper surface of the lower auxiliary electrode 171 exposed in the contact space (C). The cathode electrode 220 may be manufactured by a deposition method using a deposition material with inferior straightness, for example, sputtering process. Thus, the cathode electrode 220 may be deposited in the contact space (C) for the deposition process of the cathode electrode 220.

According to one embodiment of the present invention, the cathode electrode 220 is electrically connected with the auxiliary electrode 170 in the contact space (C) under one end of the passivation layer 175 functioning as the eave, whereby there is no need for a related art reverse-tapered partition structure. That is, it is possible to overcome problems related with collapse or peeling-off of the partition.

Although not shown, an encapsulation layer for preventing a permeation of moisture may be additionally provided on the cathode electrode 220. The encapsulation layer may be filled in the contact space (C). The encapsulation layer may be formed of various materials generally known to those in the art.

Although not shown, an opposite substrate provided with a color filter for each pixel may be additionally provided on the cathode electrode 220. In this case, white light may be emitted from the organic emitting layer 210.

A structure of the pad area (PA) on the substrate 100 will be described in detail as follows.

A buffer layer 125 is provided on the substrate 100, a gate insulating film 127 is provided on the buffer layer 125, a signal pad 300 is provided on the gate insulating film 127, an insulating interlayer 140 is provided on the signal pad 300, a pad electrode 400 is provided on the insulating interlayer 140, and a passivation layer 175 is provided on the pad electrode 400.

The buffer layer 125 extends from the active area (AA).

The gate insulating film 127 corresponds to the gate insulating film 127 provided on a lower surface of a gate electrode 130 in the active area (AA). The gate insulating film 127 and the signal pad 300 may have the same pattern.

The signal pad 300 may be formed of the same material as that of the gate electrode 130 in the active area (AA). In this case, the signal pad 300 and the gate electrode 130 may be manufactured at the same time by the same process.

The signal pad 300 may include a lower signal pad 301 and an upper signal pad 302. The lower signal pad 301 is formed of the same material as that of the aforementioned lower gate electrode 131, and the lower signal pad 301 prevents a corrosion of the upper signal pad 302. The upper signal pad 302 is formed of the same material as that of the aforementioned upper gate electrode 132, and the upper signal pad 302 lowers a resistance of the signal pad 300. In order to lower a total resistance of the signal pad 300, a thickness of the upper signal pad 302 is larger than a thickness of the lower signal pad 301, preferably.

The insulating interlayer 140 extends from the active area (AA). A seventh contact hole (CH7) is provided in the insulating interlayer 140, and the signal pad 300 is exposed via the seventh contact hole (CH7).

The pad electrode 400 is connected with the signal pad 300 via the seventh contact hole (CH7).

The pad electrode 400 may include a lower pad electrode 401, an upper pad electrode 402, and a cover pad electrode 403.

The lower pad electrode 401 may be formed of the same material as those of the lower source electrode 151, the lower drain electrode 161, and the lower auxiliary electrode 171 provided in the aforementioned active area (AA). The upper pad electrode 402 may be formed of the same material as those of the upper source electrode 152, the upper drain electrode 162, and the upper auxiliary electrode 172 provided in the aforementioned active area (AA).

The lower pad electrode 401 prevents a corrosion of the upper pad electrode 402, and also prevents a corrosion of the upper signal pad 302.

The upper pad electrode 402 lowers a resistance of the pad electrode 400. In order to lower a total resistance of the pad electrode 400, a thickness of the upper pad electrode 402 is larger than a thickness of each of the lower pad electrode 401 and the cover pad electrode 403, preferably.

The cover pad electrode 403 is provided to cover a lateral surface of the lower pad electrode 401, and lateral and upper surfaces of the upper pad electrode 402, to thereby prevent the lower pad electrode 401 and the upper pad electrode 402 from being corroded. The cover pad electrode 403 may be formed of Indium-Tin-Oxide (ITO), but not limited to this material.

The passivation layer 175 extends from the active area (AA). According as an eighth contact hole (CH8) is provided in the passivation layer 175, an upper surface of the pad electrode 400, and more particularly, an upper surface of the cover pad electrode 403 is exposed to the outside via the eighth contact hole (CH8).

Figure 3:
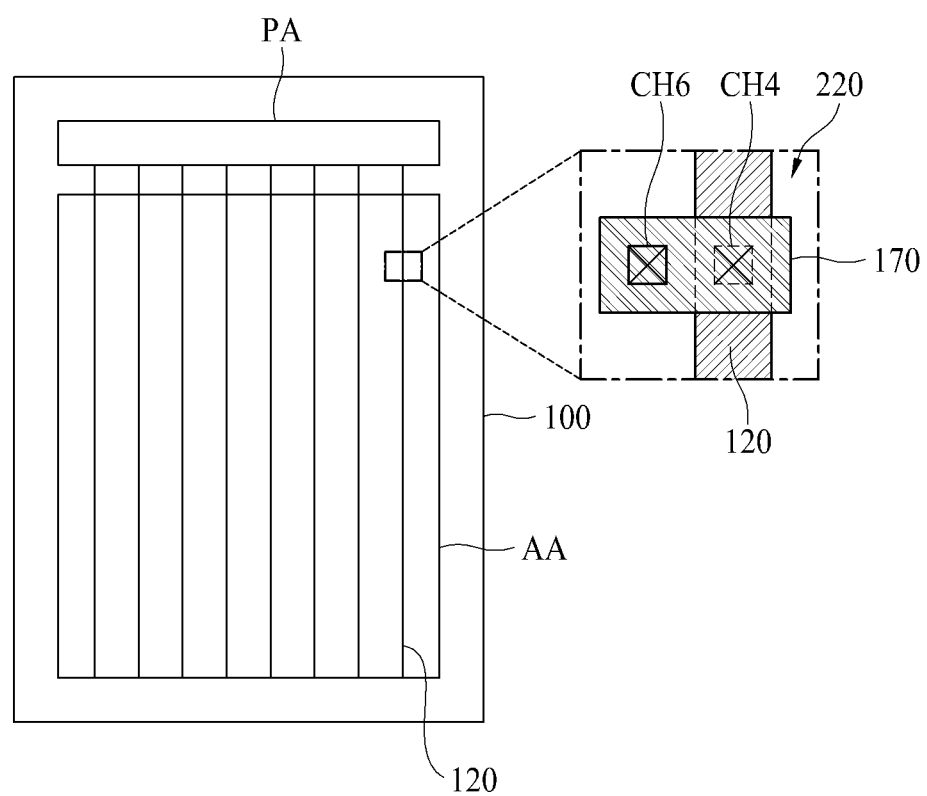
FIG. 3 is a plane view illustrating the organic light emitting display device according to one embodiment of the present invention.

FIG. 3 is a plane view illustrating the organic light emitting display device according to one embodiment of the present invention, which shows a connection area between the cathode electrode 220 and the auxiliary electrode 170.

As shown in FIG. 3, the active area (AA) and the pad area (PA) are prepared on the substrate 100, and the low-voltage line (VSS) 120 extends from the pad area (PA) to the active area (AA).

The low-voltage line (VSS) 120 is connected with the auxiliary electrode 170 via the fourth contact hole (CH4), and the auxiliary electrode 170 is connected with the cathode electrode 220 in the sixth contact hole (CH6). The cathode electrode 220 is provided in the entire active area (AA).

The fourth contact hole (CH4) and the sixth contact hole (CH6) may be provided every individual pixel, but not limited to this structure.

Figure 2:
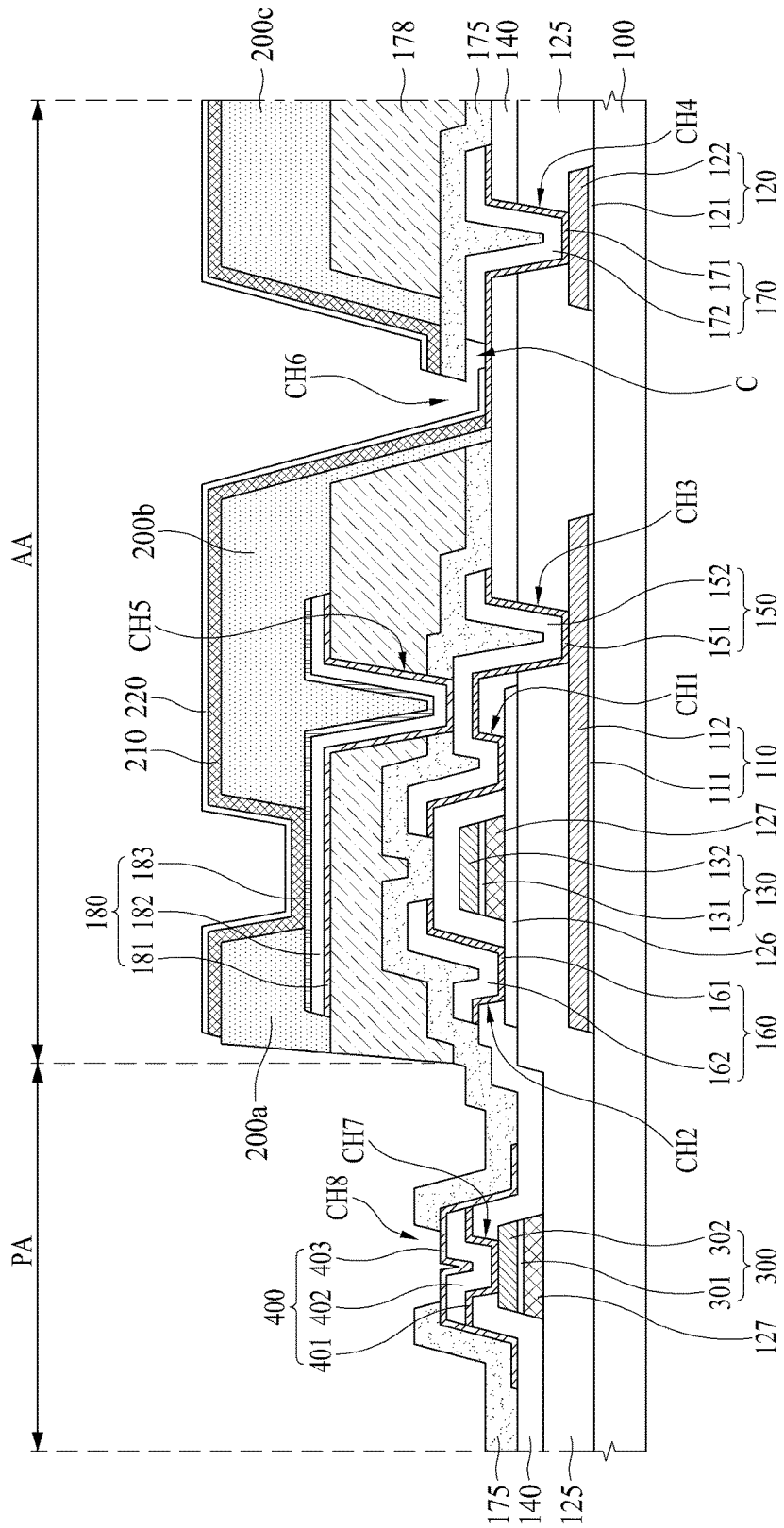
FIG. 2 is a cross sectional view illustrating an organic light emitting display device according to one embodiment of the present invention.

FIGS. 4A to 4G are cross sectional views illustrating a method of manufacturing the organic light emitting display device according to one embodiment of the present invention, which relate to the method of manufacturing the organic light emitting display device shown in FIG. 2. Accordingly, the same reference numbers will be used throughout the drawings to refer to the same or like parts, and a detailed description for the material in each element and the structure will be omitted.

Figure 4A:
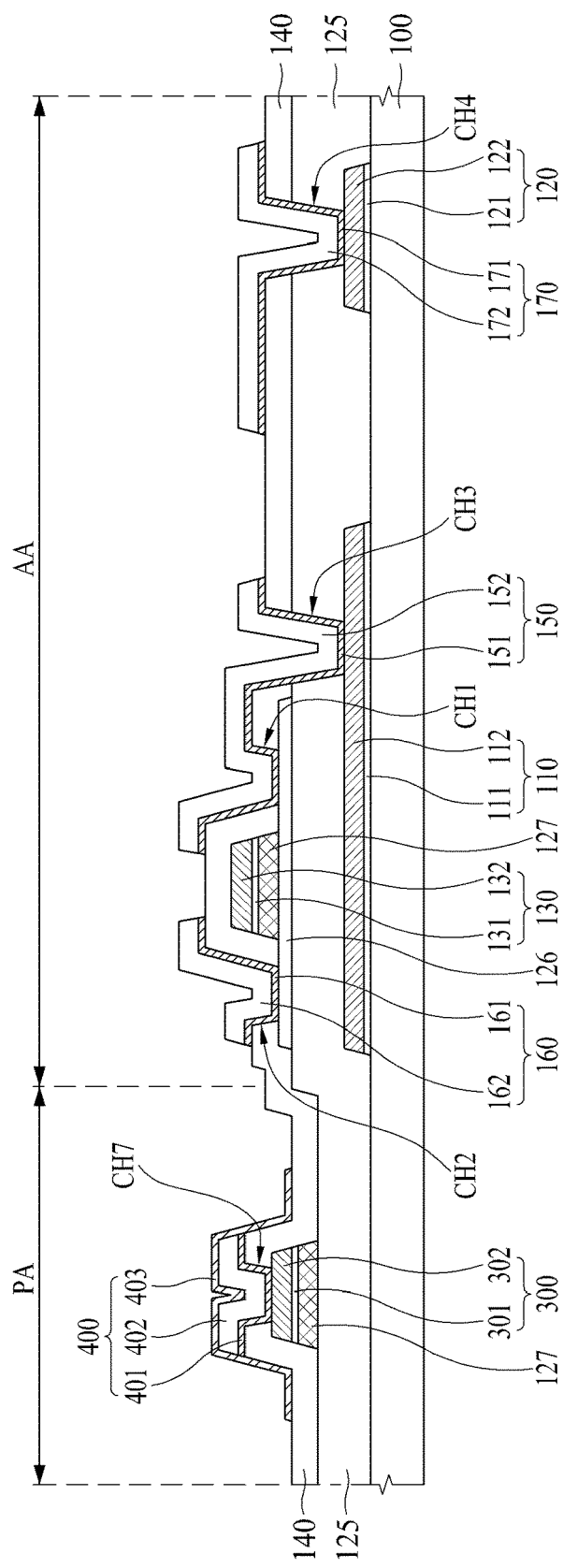
FIGS. 4A to 4G are cross sectional views illustrating a method of manufacturing the organic light emitting display device according to one embodiment of the present invention.

First, as shown in FIG. 4A, the light shielding layer 110 and the low-voltage line (VSS) 120 are patterned on the active area (AA) of the substrate 100, and the buffer layer 125 is provided on the light shielding layer 110 and the low-voltage line (VSS) 120. The buffer layer 125 is also provided on the pad area (PA).

After that, the active layer 126, the gate insulating film 127, and the gate electrode 130 are patterned on the active area (AA) of the buffer layer 125. At the same time, the gate insulating film 127 and the signal pad 300 are patterned on the pad area (PA) of the buffer layer 125.

The insulating interlayer 140 is provided on the gate electrode 130 and the signal pad 300. Also, the first contact hole (CH1) and the second contact hole (CH2) are provided in the insulating interlayer 140, to thereby expose one end and the other end of the active layer 126. Also, the third contact hole (CH3) and the fourth contact hole (CH4) are provided in the insulating interlayer 140 and the buffer layer 125, to thereby expose the light shielding layer 110 and the low-voltage line (VSS) 120. Also, the seventh contact hole (CH7) is provided in the insulating interlayer 140 of the pad area (PA), to thereby expose the signal pad 300.

Then, the source electrode 150 is patterned on the insulating interlayer 140, wherein the source electrode 150 is connected with the active layer 126 via the first contact hole (CH1), and is connected with the light shielding layer 110 via the third contact hole (CH3). The drain electrode 160 is patterned on the insulating interlayer 140, wherein the drain electrode 160 is connected with the active layer 126 via the second contact hole (CH2). Also, the auxiliary electrode 170 is patterned on the insulating interlayer 140, wherein the auxiliary electrode 170 is connected with the low-voltage line (VSS) 120 via the fourth contact hole (CH4). Also, the pad electrode 400 is patterned on the insulating interlayer 140, wherein the pad electrode 400 is connected with the signal pad 300 via the seventh contact hole (CH7).

Figure 4B:
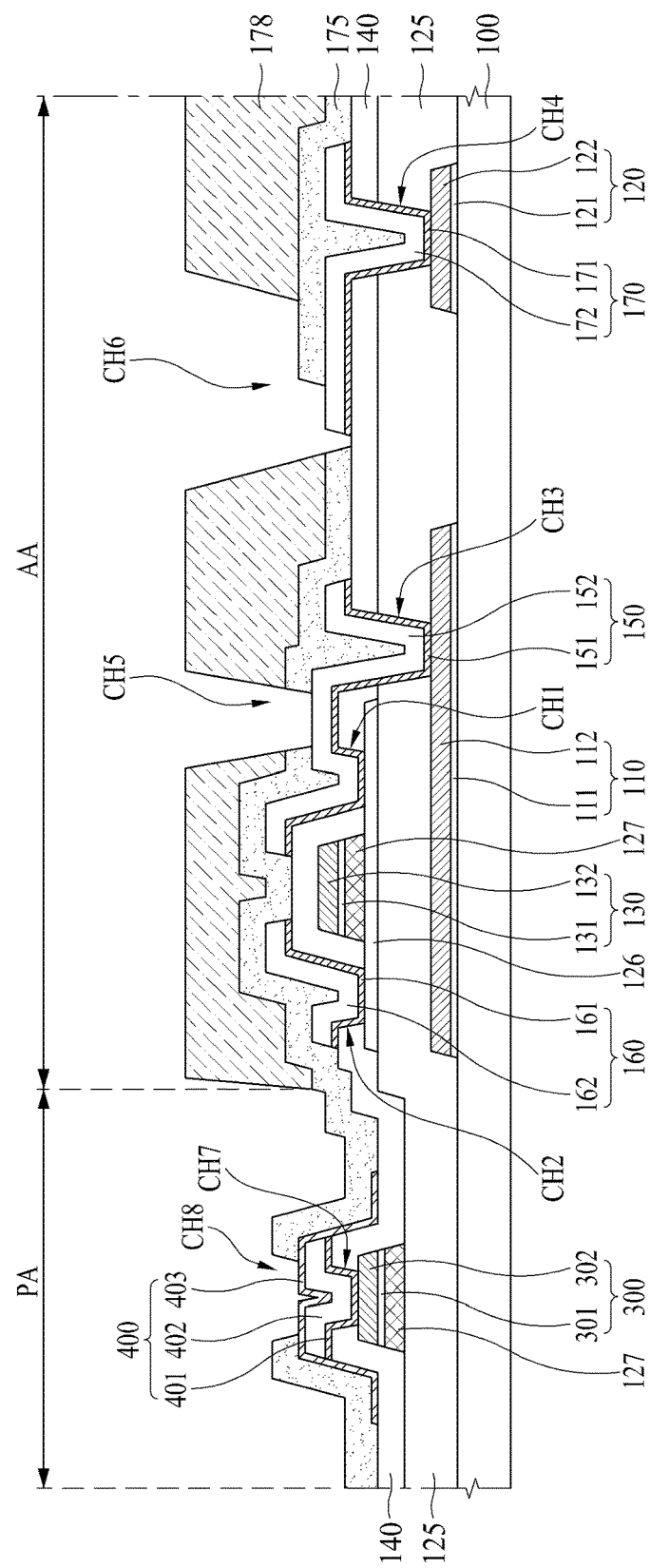

Then, as shown in FIG. 4B, the passivation layer 175 is provided on the source electrode 150, the drain electrode 160, the auxiliary electrode 170, and the pad electrode 400, and the planarization layer 178 is patterned on the passivation layer 175.

The passivation layer 175 extends from the active area (AA) to the pad area (PA), and the planarization layer 178 is provided in the active area (AA).

In this case, the fifth contact hole (CH5) is formed in the passivation layer 175 and the planarization layer 178, to thereby expose the source electrode 150. Also, the sixth contact hole (CH6) is formed in the passivation layer 175 and the planarization layer 178, to thereby expose one end of the auxiliary electrode 170. Also, the eighth contact hole (CH8) is formed in the passivation layer 175, to thereby expose the pad electrode 400.

Figure 4C:
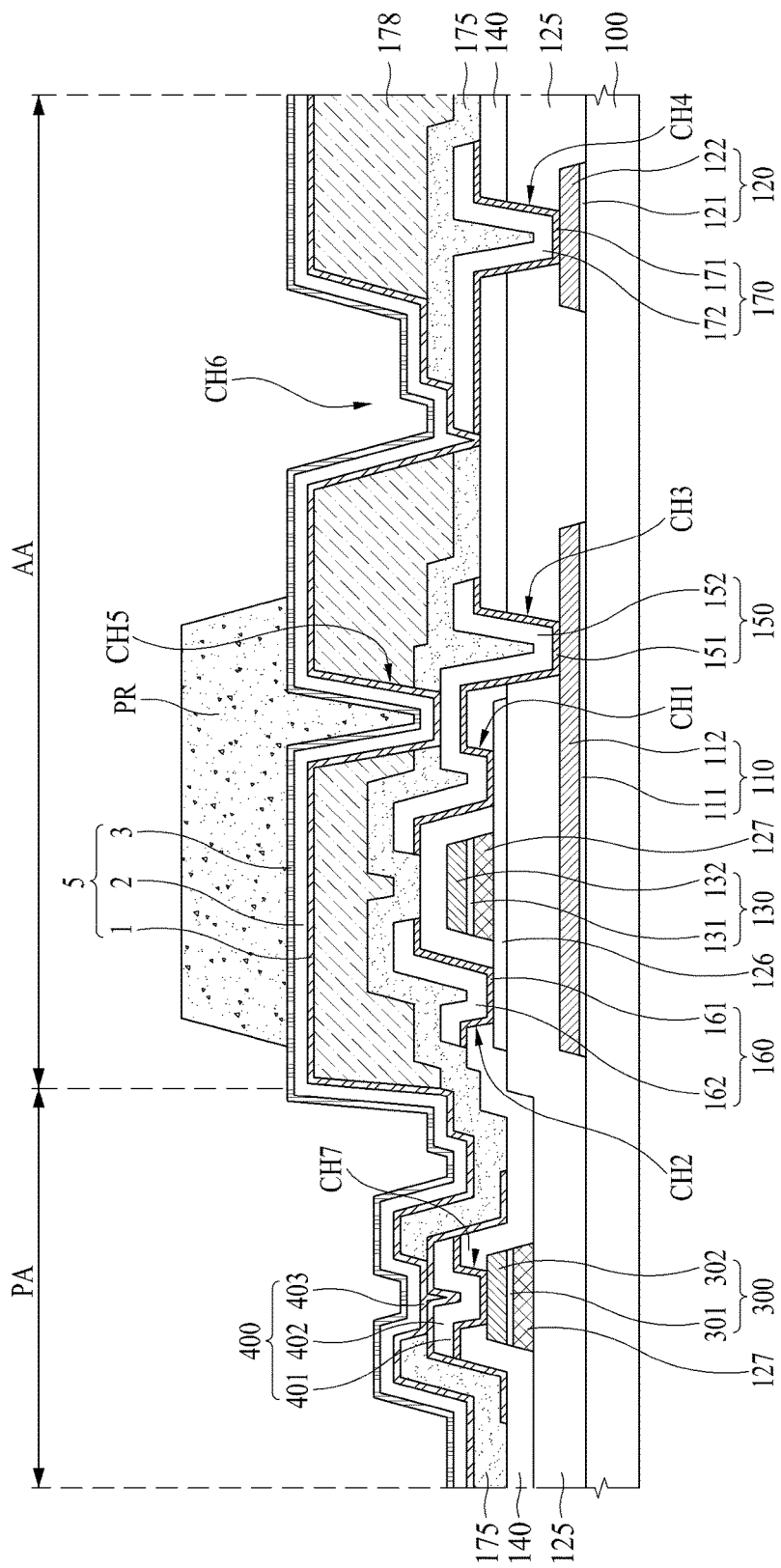

Then, as shown in FIG. 4C, an electrode layer 5 including a lower layer 1, an upper layer 2, and a cover layer 3 is provided on the passivation layer 175 and the planarization layer 178, and a photoresist layer (PR) is patterned on the electrode layer 5.

The electrode layer 5 is provided to form the anode electrode 180, to be explained later, wherein the electrode layer 5 is provided on the entire surface of the substrate 100.

The photoresist layer (PR) is formed in the same pattern as that of the anode electrode 180.

Figure 4D:
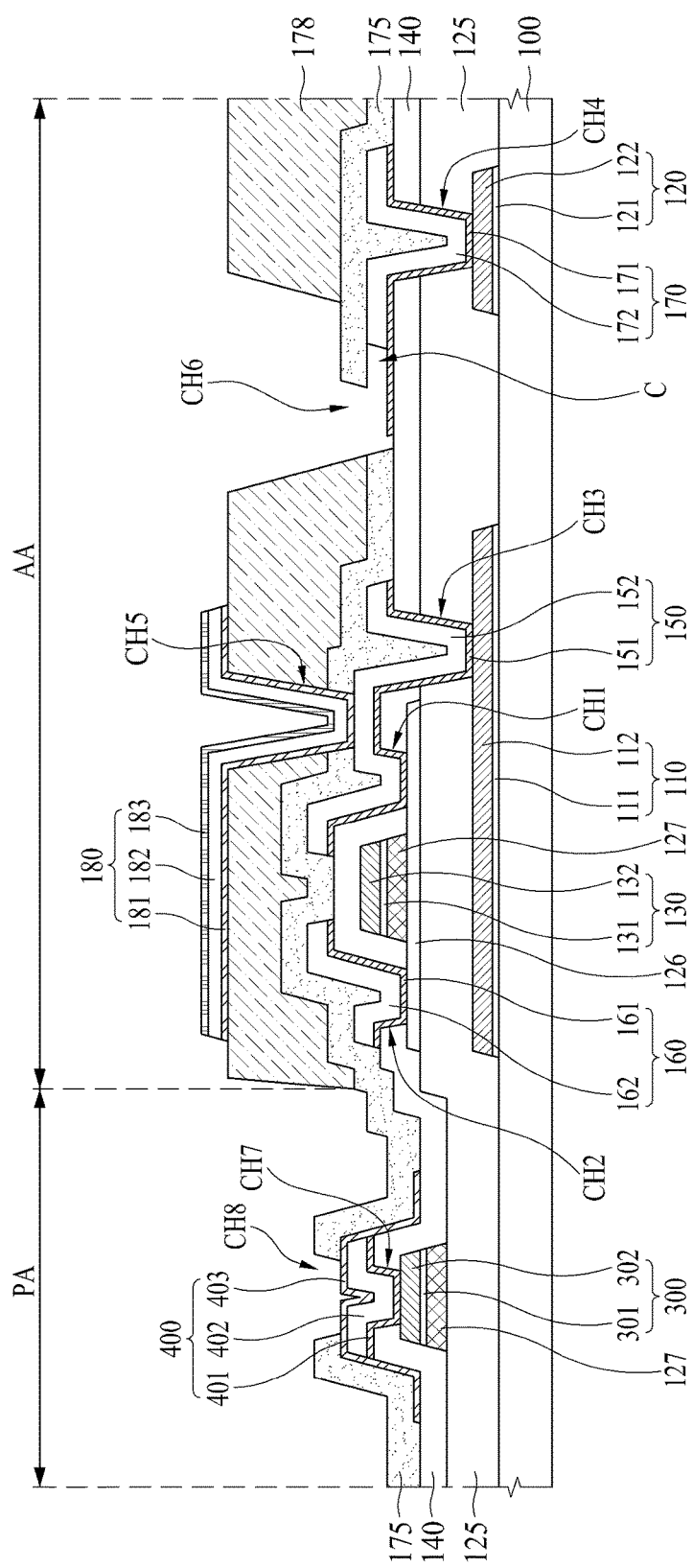

As shown in FIG. 4D, the electrode layer 5 is patterned under the condition that the photoresist layer (PR) is used as a mask, thereby forming the anode electrode 180 and removing the photoresist layer (PR). In this case, some of the auxiliary electrode 170 is removed from the sixth contact hole (CH6) so that the contact space (C) is prepared under one end of the passivation layer 175.

Eventually, the lower auxiliary electrode 171 is provided in such a way that the extending portion of the lower auxiliary electrode 171 is longer than the extending portion of the upper auxiliary electrode 172. To this end, the lower auxiliary electrode 171 is formed of a material which is not etched by an etchant used for forming the pattern of the anode electrode 180, and the upper auxiliary electrode 172 is formed of a material which is capable of being etched by the etchant used for forming the pattern of the anode electrode 180.

Figure 4E:
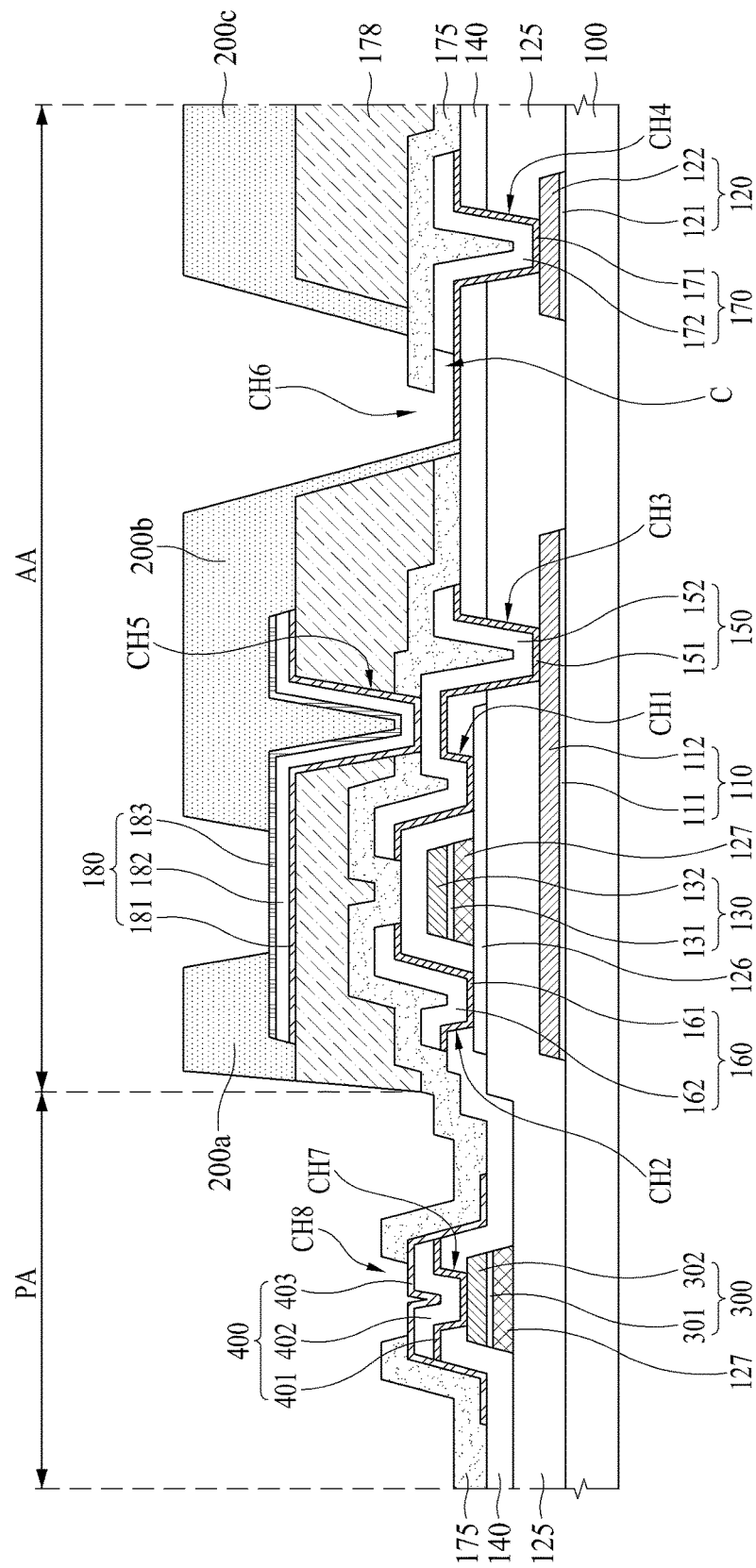

Then, as shown in FIG. 4E, the bank layer 200a, 200b, and 200c is provided on the anode electrode 180 and the planarization layer 178.

The bank layer 200a, 200b, and 200c may include the first bank layer 200a for covering one end of the anode electrode 180, the second bank layer 200b for covering the other end of the anode electrode 180 and extending along the lateral surfaces of the passivation layer 175 and the planarization layer 178 provided inside the sixth contact hole (CH6), and the third bank layer 200c provided on the passivation layer 175 and the planarization layer 178 above the auxiliary electrode 170.

Figure 4F:
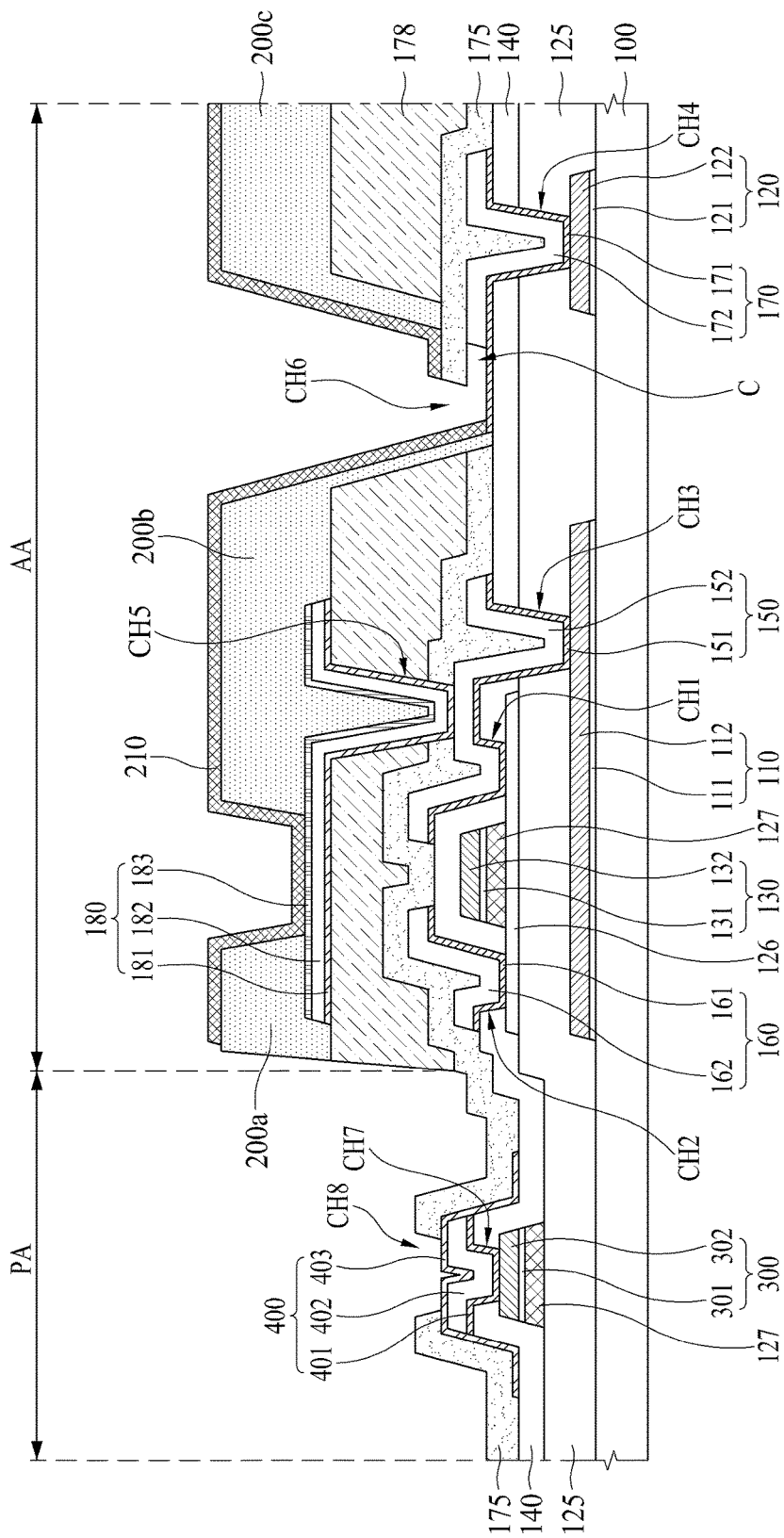

Then, as shown in FIG. 4F, the organic emitting layer 210 is provided on the bank layer 200a, 200b, and 200c in the active area (AA).

The organic emitting layer 210 may be manufactured by a deposition process using a deposition material with superior straightness, for example, evaporation process. Thus, the organic emitting layer 210 is not deposited in the contact space (C) under one end of the passivation layer 175 functioning as the eave.

Figure 4G:
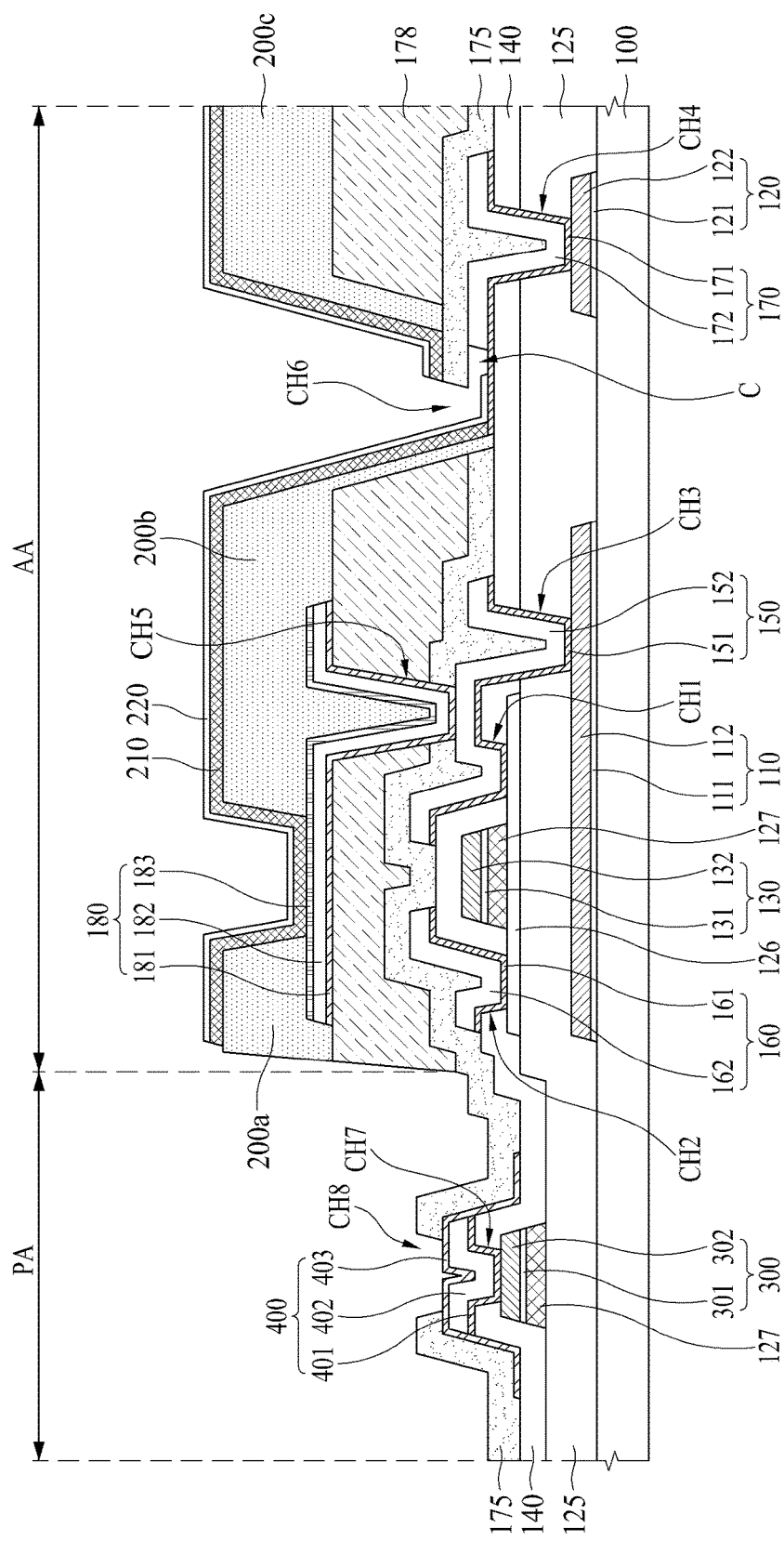

As shown in FIG. 4G, the cathode electrode 220 is provided on the organic emitting layer 210.

The cathode electrode 220 may be manufactured by a deposition method using a deposition material with inferior straightness, for example, sputtering process, whereby the cathode electrode 220 may be deposited in the contact space (C). Thus, the cathode electrode 220 is connected with the auxiliary electrode 170 in the contact space (C).

As described above, the top emission type organic light emitting display device according to the embodiments of the present invention has been described, however, it is not limited to this type, on assumption that the technical properties of the present invention are maintained. For example, in the present invention, the light may be emitted from all areas of the pixel region, but not necessarily. The light may be emitted from not all the pixel region but some area of the pixel region. That is, the light may be emitted from some area of the pixel region, and the remaining area of the pixel region may be transparent, to thereby obtain a transparent organic light emitting display device.

According to the present invention, the cathode electrode 220 is electrically connected with the auxiliary electrode 170 in the contact space (C) under one end of the passivation layer 175. Thus, there is no need for the reverse-tapered partition structure of the related art, that is, it is possible to overcome the problems related with collapse or peeling-off of the partition.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device, comprising:
   a substrate having an active area and a pad area;
   a passivation layer provided on the active area of the substrate;
   an anode electrode provided on the passivation layer;
   a bank layer for defining a pixel region on the anode electrode;
   an organic emitting layer provided on the bank layer and connected with the anode electrode;
   a cathode electrode provided on the organic emitting layer; and
   an auxiliary electrode electrically connected with the cathode electrode and provided under the passivation layer,
   wherein a contact hole for exposing the auxiliary electrode is provided in the passivation layer,
   wherein the cathode electrode is in contact with an upper surface of the auxiliary electrode via the contact hole, and
   wherein the auxiliary electrode includes a lower auxiliary electrode and an upper auxiliary electrode, and the cathode electrode is in contact with an upper surface of the lower auxiliary electrode via the contact hole.

2. The OLED device according to claim 1, wherein an extending portion of the lower auxiliary electrode is relatively longer in a direction of the contact hole than an extending portion of the upper auxiliary electrode, and the cathode electrode is in contact with the upper surface of the extending portion of the lower auxiliary electrode.

3. The OLED device according to claim 2, wherein a contact space where the upper auxiliary electrode is not provided is prepared under one end of the passivation layer, and the cathode electrode extending to the contact space is brought into contact with the upper surface of the lower auxiliary electrode.

4. The OLED device according to claim 1, wherein the lower auxiliary electrode is formed of a material which is not capable of being etched by an etchant for etching the anode electrode, and the upper auxiliary electrode is formed of a material which is capable of being etched by the etchant for etching the anode electrode.

5. The OLED device according to claim 1, further comprising a planarization layer between the passivation layer and the anode electrode,
wherein the planarization layer includes an additional contact hole for exposing a part of the auxiliary electrode.

6. The OLED device according to claim 1,
wherein the bank layer and the organic emitting layer extend along a lateral surface of the passivation layer inside the contact hole, and
the organic emitting layer is in contact with some area of the upper surface of the lower auxiliary electrode inside the contact hole.

7. The OLED device according to claim 1, further comprising a thin film transistor (TFT) including source and drain electrodes provided under the anode electrode and a gate electrode on the substrate, the source electrode being connected with the anode electrode, wherein the auxiliary electrode is provided in the same layer as that of the source the drain electrodes, and is formed of the same material as that of the source the drain electrode.

8. The OLED device according to claim 1, further comprising a low-voltage line (VSS) provided under the auxiliary electrode and connected with the auxiliary electrode via another contact hole.

9. The OLED device according to claim 8, further comprising a thin film transistor (TFT) including source and drain electrode provided under the anode electrode and a gate electrode on the substrate, and a light shielding layer including a lower light shielding layer and an upper light shielding layer provided under the TFT, the source electrode being connected with the anode electrode,
wherein the low-voltage line (VSS) is provided in the same layer as that of the light shielding layer, and is formed of the same material as that of the light shielding layer.

10. The OLED device according to claim 9, wherein the light shielding layer is connected with the source electrode.

11. The OLED device according to claim 7, wherein the gate electrode includes a lower gate electrode and an upper gate electrode, the source electrode includes a lower source electrode and an upper source electrode, and the drain electrode includes a lower drain electrode and an upper drain electrode.

12. The OLED device according to claim 7, wherein the source electrode, the drain electrode, and the auxiliary electrode is manufactured by the same process.

13. The OLED device according to claim 1, further comprising:
a signal pad provided on the pad area of the substrate; and
a pad electrode provided on the signal pad and connected with the signal pad via a still another contact hole,
wherein the passivation layer extends to the pad area, and includes a yet another contact hole for exposing an upper surface of the pad electrode.

14. The OLED device according to claim 11, wherein a resistance in the material for the upper source electrode, the upper drain electrode, and the upper auxiliary electrode is lower than a resistance in the material for the lower source electrode, the lower drain electrode, and the lower auxiliary electrode.

15. The OLED device according to claim 11, wherein a thickness of the upper source electrode, the upper drain electrode, and the upper auxiliary electrode is larger than a thickness of the lower source electrode, the lower drain electrode, and the lower auxiliary electrode.

16. A method of manufacturing an OLED device comprising:
providing an auxiliary electrode including a lower auxiliary electrode and an upper auxiliary electrode on a substrate;
providing a passivation layer and a planarization layer on the auxiliary electrode, wherein a contact hole for exposing the auxiliary electrode is provided in the passivation layer and the planarization layer;
providing an anode electrode on the planarization layer;
providing a bank layer on the anode electrode;
providing an organic emitting layer on the bank layer; and
providing a cathode electrode on the organic emitting layer,
wherein the cathode electrode is brought into contact with an upper surface of the lower auxiliary electrode via the contact hole.

17. The OLED device according to claim 16, wherein an extending portion of the lower auxiliary electrode is relatively longer in a direction of the contact hole than an extending portion of the upper auxiliary electrode, and the cathode electrode is in contact with the upper surface of the extending portion of the lower auxiliary electrode.

18. The method according to claim 16, wherein the step of providing the anode electrode includes preparing a contact space in the contact hole by removing some of the upper auxiliary electrode exposed via the contact hole.

19. The method according to claim 18, wherein the cathode electrode is brought into contact with the upper surface of the lower auxiliary electrode in the contact space.

20. The method according to claim 18, wherein the upper auxiliary electrode is not provided in the contact space under one end of the passivation layer functioning as an eave.

21. The method according to claim 16, wherein the lower auxiliary electrode is formed of a material which is not capable of being etched by an etchant for etching the anode electrode, and the upper auxiliary electrode is formed of a material which is capable of being etched by the etchant for etching the anode electrode.

22. The method according to claim 16, further comprising:
providing a low voltage line (VSS) under the auxiliary electrode and connected with the auxiliary electrode via an additional contact hole.

23. The method according to claim 22,
wherein the low-voltage line (VSS) is provided in the same layer as that of the light shielding layer, and is formed of the same material as that of the light shielding layer.

* * * * *